(12) United States Patent
Kim

(10) Patent No.: US 8,994,412 B2
(45) Date of Patent: Mar. 31, 2015

(54) OUTPUT DRIVER FOR HIGH VOLTAGE AND WIDE RANGE VOLTAGE OPERATION AND DATA OUTPUT DRIVING CIRCUIT USING THE SAME

(71) Applicant: SAMSUNG Electronics Co., Ltd., Suwon-si, Gyeonggi-do (KR)

(72) Inventor: Eonguk Kim, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/799,866

(22) Filed: Mar. 13, 2013

(65) Prior Publication Data

US 2014/0002146 A1  Jan. 2, 2014

(30) Foreign Application Priority Data

Jun. 27, 2012  (KR) ......................... 10-2012-0069125

(51) Int. Cl.
| | |
|---|---|
| H03K 3/00 | (2006.01) |
| H03K 17/081 | (2006.01) |
| H03K 19/0185 | (2006.01) |
| H03K 17/10 | (2006.01) |

(52) U.S. Cl.
CPC .. *H03K 17/08104* (2013.01); *H03K 19/018521* (2013.01); *H03K 17/102* (2013.01)
USPC ........................................................ 327/109

(58) Field of Classification Search
None
See application file for complete search history.

(56) References Cited

U.S. PATENT DOCUMENTS

| | | | |
|---|---|---|---|
| 5,684,415 A | 11/1997 | McManus | |
| 5,736,869 A | 4/1998 | Wei | |
| 5,900,750 A | 5/1999 | Schmitt | |
| 5,969,542 A | 10/1999 | Maley et al. | |
| 6,373,282 B1 | 4/2002 | Drapkin et al. | |
| 6,870,407 B2 | 3/2005 | Lundberg | |
| 6,980,035 B1 | 12/2005 | Zhou et al. | |
| 7,164,305 B2 * | 1/2007 | Gupta et al. | 327/333 |
| 7,215,146 B2 | 5/2007 | Khan | |
| 7,511,534 B1 | 3/2009 | Bringivijayaraghavan et al. | |
| 7,724,045 B2 | 5/2010 | Ueno | |
| 7,755,393 B1 | 7/2010 | Song | |
| 8,446,173 B1 * | 5/2013 | Faucher et al. | 326/86 |
| 2009/0091986 A1 * | 4/2009 | Bringivijayaraghavan et al. | 365/189.05 |

(Continued)

FOREIGN PATENT DOCUMENTS

| | | |
|---|---|---|
| JP | 09-139663 | 5/1997 |
| JP | 10-041806 | 2/1998 |

(Continued)

OTHER PUBLICATIONS

Anne-Johan Annema et al., "5.5-V I/O in a 2.5-V 0.25-_m CMOS Technology", IEEE Journal of Solid-State Circuits, vol. 36, No. 3, Mar. 2001, p. 528~538.

(Continued)

*Primary Examiner* — Lincoln Donovan
*Assistant Examiner* — Khareem E Almo
(74) *Attorney, Agent, or Firm* — Ellsworth IP Group, PLLC

(57) ABSTRACT

An output driver and a data output driving circuit using the output driver includes a pull-up driver including at least three pull-up transistors connected between a high voltage and an output node in a stack structure of three stages or more and a pull-down driver including at least three pull-down transistors connected between a ground node and the output node in a stack structure of three stages or more.

34 Claims, 12 Drawing Sheets

(56) References Cited

U.S. PATENT DOCUMENTS

2010/0176848 A1    7/2010  Du et al.
2010/0271118 A1   10/2010  Bhattacharya et al.
2011/0025380 A1    2/2011  Kim et al.
2011/0316505 A1*  12/2011  Shrivastava .................. 323/282

FOREIGN PATENT DOCUMENTS

KR    1020000074289    12/2000
KR     100774893       11/2007

OTHER PUBLICATIONS

H'ector S'anchez et al., "A Versatile 3.3/2.5/1.8-V CMOS I/O Driver Built in a 0.2-m, 3.5-nm Tox, 1.8-V CMOS Technology", IEEE Journal of Solid-State Circuits, vol. 34, No. 11, Nov. 1999, p. 1501~1511.

Chua-Chin Wang et al., "A 125-MHz Wide-Range Mixed-Voltage I/O Buffer Using Gated Floating N-well Circuit", 2010 IEEE, p. 3421~3424.

* cited by examiner

OUTPUT DRIVER FOR HIGH VOLTAGE AND WIDE RANGE VOLTAGE OPERATION AND DATA OUTPUT DRIVING CIRCUIT USING THE SAME

CROSS-REFERENCE TO RELATED APPLICATIONS

This U.S. non-provisional patent application claims priority under 35 U.S.C. §119 to Korean Patent Application No. 10-2012-0069125, filed on Jun. 27, 2012, the entire contents of which are hereby incorporated by reference.

BACKGROUND

1. Field

The present inventive concept herein relates to a driving circuit of a semiconductor device, and more particularly, to an output driver and a data output driving circuit using the same 2. Description of the Related Art In a recent semiconductor chip, a high speed interface IP requiring a low power supply voltage and a high speed operation is commonly used. As a device constituting an operation circuit in a chip, CMOSFETs having a medium gate oxide film for an operation of 1.8V is used more often than CMOSFETs having a thick gate oxide film for 3.3V.

However, an input/output circuit still needs to support an application requiring an interface voltage of 1.8V~3.3V. When a voltage of 3.3V is applied, an input/output circuit manufactured by CMOSFETs having a medium gate oxide film for an operation of 1.8V has a difficulty of operation due to device destruction.

A general purpose input/output (GPIO) circuit for high voltage made using low voltage transistors may face at least one problem of reliability degradation of the transistor device due to overvoltage, an increase of static power consumption, degradation of an operation speed and a restriction of a wide range performance. Thus, it is difficult that the GPIO reliably and rapidly supports a mobile field or a high speed application field.

SUMMARY

The present general inventive concept provides a driver having one or more transistors to be useable with a high voltage and a wide range voltage operation, and an output circuit device having the same.

Additional features and utilities of the present general inventive concept will be set forth in part in the description which follows and, in part, will be obvious from the description, or may be learned by practice of the general inventive concept.

Embodiments of the inventive concept provide an output driver. The output driver may include a pull-up driver in which first, second and third transistors of a first conductivity type are connected by a cascode structure between a voltage supply node and an output node, and a pull-down driver in which first, second and third transistors of a second conductivity type are connected by a cascode structure between a ground node and the output node.

Embodiments of the inventive concept also provide a data output driving circuit. The data output driving circuit may include a reference voltage generator to compare a voltage that monitored a high voltage with a power supply voltage autonomously without depending on an external control to variably generate a reference voltage as a bias voltage, a level shifter to shift input data to a swing level of high voltage to output the shifted input data as a pull-up driving control voltage, a dynamic gate control unit to receive the high voltage and the reference voltage as an operation power supply and to generate pull-up and pull-down gate control voltages in response to voltage levels of an output node voltage, the pull-up driving control voltage and the input data, and an output driver that has a pull-up driver in which first, second and third transistors of a first conductivity type are connected by a cascode structure between the voltage supply node and the output node and a pull-down driver in which first, second and third transistors of a second conductivity type are connected by a cascode structure between a ground node and the output node, a driving operation of the output driver being controlled by the dynamic gate control unit.

Embodiments of the inventive concept also provide a level shifter. The level shifter may include a pull-up unit and a pull-down unit connected to each other through a biasing unit, a speed up unit to increase a level shifting operation speed of input data being applied through a first gating node, a data contention prevention unit connected between the speed up unit and the pull-up unit to prevent a data contention of an output terminal at which a pull-up driving control voltage is output by turning off a pull-up transistor in the pull-up unit before a pull-down transistor in the pull-down unit operates, and a hot carrier injection prevention unit connected between the biasing unit and the pull-down unit to prevent a hot carrier from being injected into pull-down transistors in the pull-down unit.

Embodiments of the inventive concept also provide a method of controlling an output driver. The method may include forming a pull-up driver that first, second and third transistors of a first conductivity type are connected between a high voltage supply node higher than a power supply voltage and an output node in a cascode structure and a pull-down driver that first, second and third transistors of a second conductivity type are connected between a ground node and the output node in a cascode structure as an output driver, controlling a voltage difference between a drain and a source of each of the first, second and third transistors of first conductivity type below a level of the power supply voltage when pulling up the pull-up driver depending on input data, and controlling a voltage difference between a drain and a source of each of the first, second and third transistors of second conductivity type below a level of the power supply voltage when pulling down the pull-down driver depending on the input data.

The foregoing and/or other features and utilities of the present general inventive concept may be achieved by providing an output driver including a pull-up driver including three or more first type transistors connected between a voltage supply node and an output node of a pad, and a pull-down driver including three or more second type transistors connected between the output node of the pad and a ground potential node. An output voltage may be output through the output node of the pad according to an alternative operation of the pull-up driver and the pull-down driver.

The three or more first type transistors and the three or more second type transistors may be in operable state with an operation voltage lower than a difference between voltages of the voltage supply node and output node and a difference between voltages of the output node and the ground node, respectively.

The pull-up driver and the pull-down driver may selectively output an output voltage to the output node of the pad, and the output voltage may have a voltage range same as that of the voltage supply node The pull-up driver and the pull-down driver may be selectively in an operable state with a high voltage of the voltage supply node, and the three or more first type transistors and the three or more second type transistors may be in an operable state with a low voltage lower than a half of the high voltage of the voltage supply node.

The pull-up driver and the pull-down driver may be selectively in operable state according to input data and a level of a voltage of the voltage supply node.

The three or more first type transistors of the pull-up driver may have gates to sequentially receive corresponding gate signals such that the pull-up driver is an operable state in response to a difference between voltages of the voltage supply node and the output node. The three or more second type transistors of the pull-down driver may have gates to sequentially receive corresponding gate signals such that the pull-down driver is an operable state in response to a difference between voltages of the output node and the ground node.

A pull-up voltage range of voltages of the pull-up driver between the voltage supply node and the output node and a pull-down voltage range of voltages of the pull-down driver between the output node and the ground node may be same. A voltage range of a voltage to be applied to each of the transistors may be smaller than the pull-up and pull-down voltage ranges.

The transistors have an operation voltage lower than a voltage of the voltage supply node. The number of the three or more transistors of each of the pull-up driver and the pull-down driver may be at least a sum of two and a number corresponding to a ratio of the operation voltage and a voltage of the voltage supply node.

The foregoing and/or other features and utilities of the present general inventive concept may be achieved by providing an electronic system including an output driver control unit to sequentially generate pull-up gate signals and pull-down gate signals in response to input data and a voltage of a voltage supply node, and an output driver including a pull-up driver including three or more first type transistors connected in series between the voltage supply node and an output node of a pad to be operable according to the sequential pull-up gate signals to output an output voltage to the output node of the pad, and a pull-down driver including three or more second type transistors connected in series between the output node of the pad and a ground node to be operable according to the sequential pull-down gate signals to output the output voltage to the output node of the pad.

The system may further include a functional circuit connected to the output node of the pad to perform a function thereof according to the output voltage of the output node of the pad. The output voltage of the output node and the voltage of the voltage supply node may have a maximum voltage range, and voltages applied to the respective transistors may have a voltage range lower than a half of the maximum voltage range.

BRIEF DESCRIPTION OF THE DRAWINGS

These and/or other features and utilities of the present general inventive concept will become apparent and more readily appreciated from the following description of the embodiments, taken in conjunction with the accompanying drawings.

DETAILED DESCRIPTION OF THE EMBODIMENTS

Figure 1:
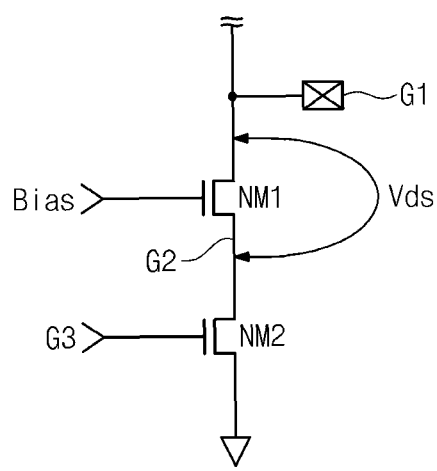
FIG. 1 is a view illustrating a pull-down operation of a simple two-stage pull-down driver.
Figure 1:
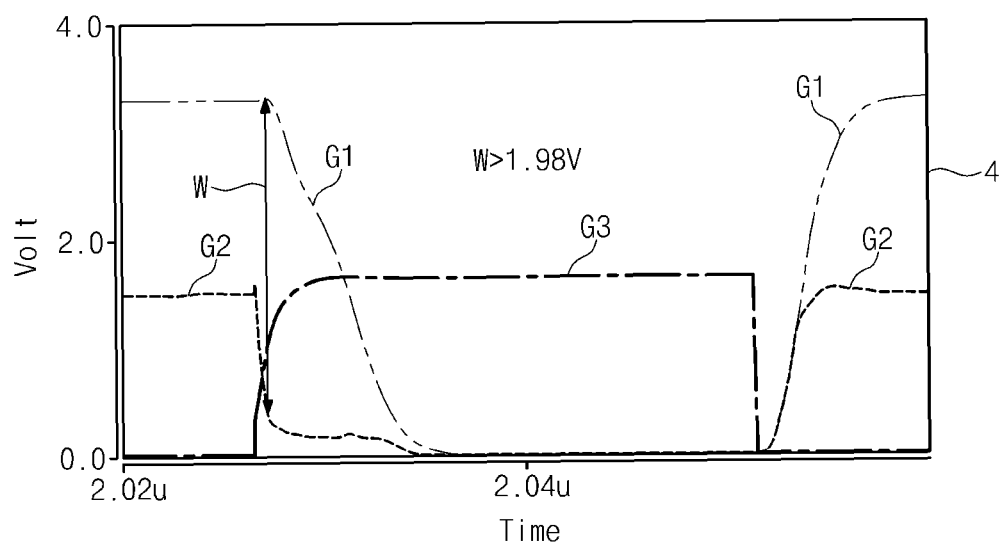

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

FIG. 1 is a view illustrating a pull-down operation of a simple two-stage pull-down driver 2. Referring to FIG. 1, the pull-down driver 2 constituted by a two-stage stack structure may be provided between an output pad and a ground.

A drain of the pull-down driver 2 includes a first N-type MOS transistor NM1 having a drain connected to the output pad and a gate to receive a bias voltage, and a second N-type MOS transistor NM2 having a drain and a source connected to a source of the first N-type MOS transistor NM1 and the ground, respectively, and a gate to receive a pull-down drive voltage G3.

If the first and second N-type MOS transistors NM1 and NM2 are manufactured as a device to be used in a low voltage operation, it is difficult for the transistors NM1 and NM2 to be applied to a high voltage operation because of reliability degradation. In a case that the transistors NM1 and NM2 are manufactured to have a medium gate oxide film for 1.8V operation, operation reliability of the transistors NM1 and NM2 may be severely degraded due to the vulnerability of a hot carrier injection (HCI) characteristic when a high voltage, for example, a voltage of 3.3V, is applied in a high voltage operation.

In a graph 4 of FIG. 1, a horizontal axis represents a time and a vertical axis represents a voltage. Referring to the graph 4, a voltage Vds between a drain and a source of the first N-type MOS transistor NM1 has a voltage difference of W when a pull-down operation starts in a high voltage operation, for example, an operation of 3.3V. In the graph 4, G1 indicates a voltage of the output pad of the pull-down driver 2 and G2 indicates a voltage of a source of the first N-type MOS transistor NM1. G3 indicates a voltage applied to a gate of the second N-type MOS transistor NM2.

In an operation of 3.3V, if the pull-down drive voltage G3 being applied to the gate of the second N-type MOS transistor NM2 rises from 0V toward 1.8V, the second N-type MOS transistor NM2 is turned on. At this time, a falling speed of a voltage level of the G2 is faster than a falling speed of a voltage level of the G1. This is because a loading of the first N-type MOS transistor NM1 connected to the output pad is greater than a loading of the second N-type MOS transistor NM2. Thus, the voltage Vds between a drain and a source of the first N-type MOS transistor NM1 is represented by a voltage difference of W at the start of pull-down operation. The W is 1.98V or more. If a voltage between a drain and a source of the first N-type MOS transistor NM1 manufactured for an operation of 1.8V is 1.98V or more, a hot carrier injection (HCI) phenomenon may be induced in the first N-type MOS transistor NM1. Since a gate oxide film of a transistor can be destructed or damaged, operation reliability may be degraded. If an output driver manufactured by a manufacturing process for a low voltage operation is used in a high voltage operation, it is difficult for the output driver to reliably perform a high voltage operation and a high speed operation due to the vulnerability of hot carrier injection (HCI) characteristic of transistor being stacked.

Since an output driver having a simple two-stage pull-down driver has to control a bias voltage using a separate external pin, it is difficult to have a wide range voltage operation without using a separate external pin.

In embodiments of the inventive concept, an output driver may be prepared to include a pull-up driver or a pull-down driver that a source-drain channel or a drain-source channel is connected by a three-stage cascode structure.

Figure 2:
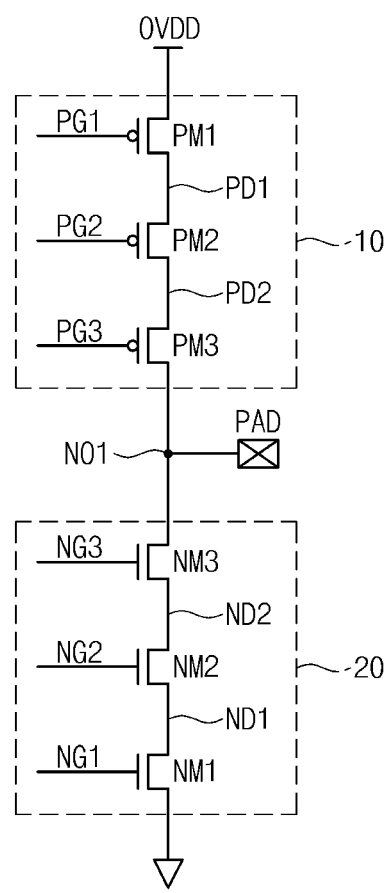
FIG. 2 is a circuit diagram illustrating an output driver according to an embodiment of the inventive concept.

FIG. 2 is a circuit diagram illustrating an output driver according to an embodiment of the inventive concept.

Referring to FIG. 2, the output driver includes a pull-up driver 10 having a plurality of transistors, for example, first, second and third transistors PM1, PM2 and PM3 of first conductivity type (P-type) transistors connected by a cascode structure between a voltage supply node OVDD and an output node NO1 and a pull-down driver 20 having a plurality of transistors, for example, first, second and third transistors NM1, NM2 and NM3 of second conductivity type (N-type) transistors connected by a cascode structure between a ground node VSS and the output node NO1.

A high voltage (or a first power supply voltage when being toggled), a first power supply voltage (or a high voltage when being toggled) and a ground voltage (or a first power supply voltage when being toggled) may be sequentially applied to gates of the first, second and third transistors PM1, PM2 and PM3 of first conductivity type (P-type) transistors, respectively, and a ground voltage (or a second power supply voltage when being toggled), a second power supply voltage and a high voltage (or a second power supply voltage when being toggled) may be sequentially applied to gates of the first, second and third transistors NM1, NM2 and NM3 of second conductivity type (N-type) transistors, respectively.

The high voltage OVDD may be 3.3V and the second power supply voltage may be 1.8V. The first power supply voltage is a voltage obtained by subtracting the second power supply voltage from the high voltage and may be about 1.5V. Thus, the second power supply voltage is higher than the first power supply voltage.

The first, second and third transistors PM1, PM2 and PM3 and the first, second and third transistors NM1, NM2 and NM3 may be manufactured using a CMOS manufacturing process for an operation of 1.8V. The transistors constituting the output driver of FIG. 2 are CMOSFETs having a medium gate oxide film for an operation of 1.8V.

Here, the N-type MOS transistor may be referred to as NMOSFET and the P-type MOS transistor may be referred to as PMOSFET.

A voltage swing range of the output node NO1 connected the output pad PAD of the output driver may be from 0V to 3.3V. If input data of a logic "low" is applied, a voltage of the output node NO1 becomes 3.3V by driving the pull-up driver 10. If input data transits to a logic "high", a voltage of the output node NO1 is toggled to 0V by driving the pull-down driver 20.

Figure 3:
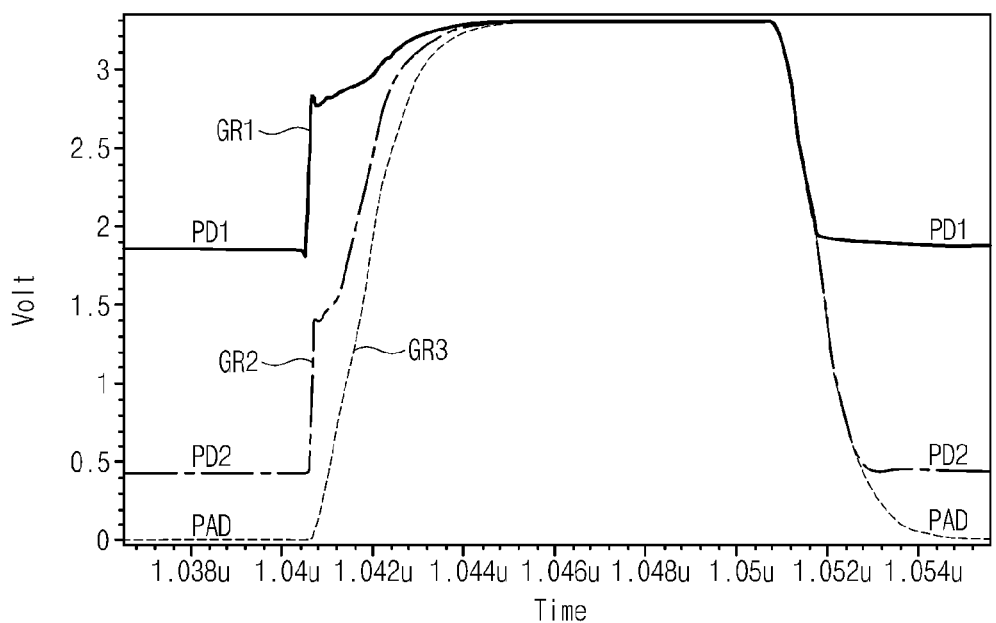
FIG. 3 is an operation waveform of the output driver of FIG. 2 according to an embodiment of the inventive concept.
Figure 4:
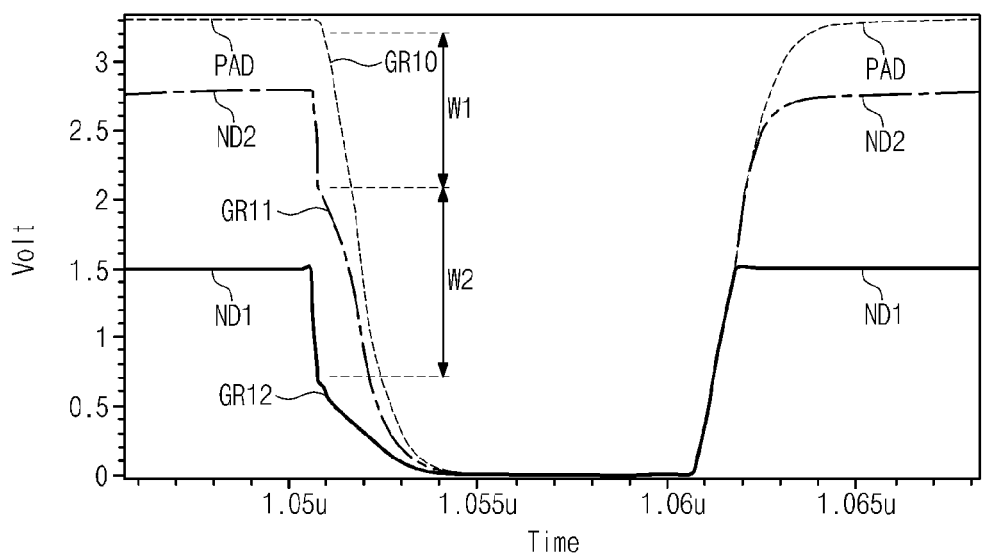
FIG. 4 is an operation waveform of the output driver of FIG. 2 according to an embodiment of the inventive concept.

FIG. 3 illustrates an operation waveform of the output driver of FIG. 2 and FIG. 4 illustrates an operation waveform of the output driver of FIG. 2, according to an embodiment of the present general inventive concept.

Referring to FIG. 3, a horizontal axis represents a time and a vertical axis represents a voltage. A graph GR1 represents a voltage waveform of a drain node PD1 of the PMOS transistor PM1 and a graph GR2 represents a voltage waveform of a drain node PD2 of the PMOS transistor PM2. A graph GR3 represents a voltage waveform of a PAD connected to the output node NO1 when a pull-up operation is performed.

Referring to FIG. 4, a horizontal axis represents a time and a vertical axis represents a voltage. A graph GR12 represents a voltage waveform of a drain node ND1 of the NMOS transistor NM1 and a graph GR11 represents a voltage waveform of a drain node ND2 of the NMOS transistor NM2. A graph GR10 represents a voltage waveform of a PAD connected to the output node NO1 when a pull-down operation is performed.

Referring to FIG. 4, when an operation of 3.3V is performed, voltage levels of the nodes PAD, ND2 and ND1 are 3.3V, 2.75V and 1.5V, respectively, as illustrated in the graph of FIG. 4. In this state, if the first, second and third N-type MOS transistors NM1, NM2 and NM3 begin to be turned on by their gate voltages, a voltage Vds between a drain and a source of the third N-type MOS transistor NM3 has a voltage difference of W1 at the start of pull-down operation and a voltage Vds between a drain and a source of the second N-type MOS transistor NM2 has a voltage difference of W2 at the start of pull-down operation.

In an operation of 3.3V, a voltage difference W of FIG. 1 may be divided into the voltage differences W1 and W2 by the third and second NMOS transistors NM3 and NM2. Since voltages, for example, 1.8V or less, are given or applied between drains-sources of the first, second and third N-type MOS transistors NM1, NM2 and NM3 manufactured for a lower voltage operation, for example, an operation of 1.8V, phenomenon of the hot carrier injection HCI may be minimized or prevented.

Accordingly, the destruction of a gate oxide film of transistor is prevented and thereby operation reliability of the output driver is improved. Even in a case that an output driver manufactured by a manufacturing process for a low voltage operation with a low voltage is used in a high voltage operation with a high voltage, if the output driver gets a cascode structure that 3 or more stages are stacked, the output driver may free from the vulnerability of HCI characteristic.

Figure 5:
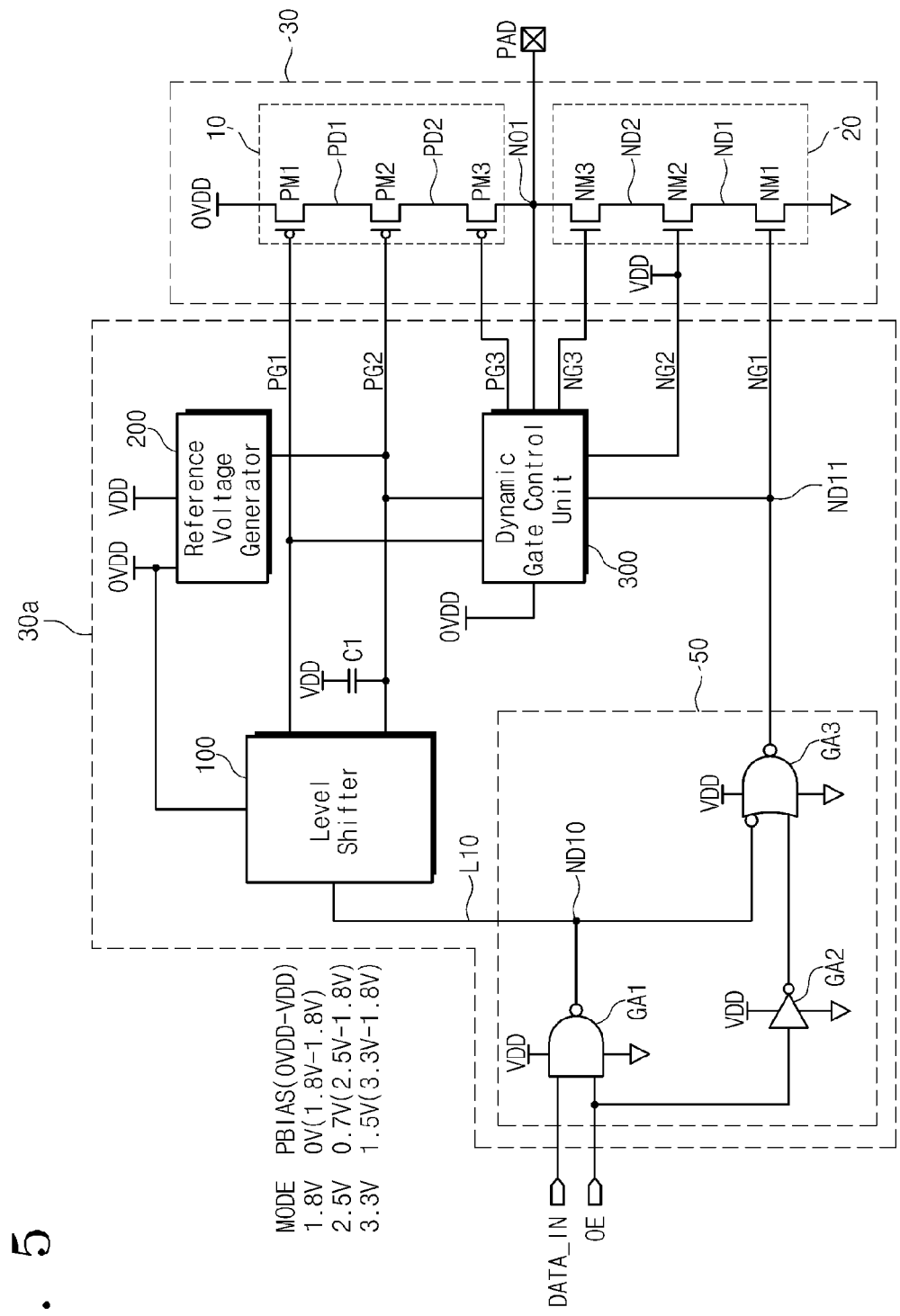
FIG. 5 is a diagram illustrating an output driving circuit using the output driver of FIG. 2 according to an embodiment of the present general inventive concept.

FIG. 5 is a diagram illustrating a data output driving circuit using the output driver of FIG. 2 according to an embodiment of the present general inventive concept.

Referring to FIG. 5, the data output driving circuit includes an input gating unit 50, a level shifter 100, a reference voltage generator 200, a dynamic gate control unit 300 and an output driver 30. Here, the input gating unit 50, the level shifter 100, the reference voltage generator 200, and the dynamic gate control unit 300 may be referred to as an output driver control unit 30a to generate control signals (gate control signals) to timely be applied to the output driver 30 having transistors requiring a low bias voltage according to a high bias voltage, and a reference voltage, and input data, so that the transistors of the output driver can be operable with the high bias voltage to output an output signal corresponding to the high bias voltage.

The input gating unit 50 gates input data DATA_IN according to a state of an output enable (OE) signal to output the gated data as a swing level of a power supply voltage VDD to first and second gating nodes ND10 and ND11. The input gating unit 50 may include a NAND gate GA1, an inverter GA2 and a NOR gate GA3. The NAND gate GA1 receives the input data DATA_IN and the output enable (OE) state to generate a NAND response to the first gating node ND10. The inverter GA2 inverts the state of the output enable (OE) signal. The NOR gate GA3 receives a logic that an output of the NAND gate GA1 is inverted and an output logic of the inverter GA2 to generate a NOR response, that is, a voltage (or a pull-down driving voltage) NG1 to the second gating node ND11.

Without depending on an external control, the reference voltage generator 200 autonomously compares a voltage corresponding to a high voltage OVDD with a voltage corresponding to the power supply voltage VDD to variably generate a reference voltage as a bias voltage PBIAS. The reference voltage generator 200 may be embodied like FIG. 7.

The level shifter 100 shifts the NAND response being applied to the first gate node ND10 as a swing level of the high voltage OVDD to output the shifted data as a pull-up driving control voltage PG1 to the P-type MOS transistor PM1. The level shifter 100 may be embodied like FIG. 6.

The dynamic gate control unit 300 receives the high voltage OVDD and the reference voltage PBIAS as an operation power supply voltage and generates a pull-up and a pull-down gate control voltages PG3 and NG3 in response to an output node (NO1) voltage of the PAD, the pull-up driving control voltage PG1 and a voltage NG1 as a voltage level of the input data being applied through the second gating node ND11.

The dynamic gate control unit 300 receives a feedback of the output node NO1 voltage to control levels of the control voltages PG3 and NG3. If the output node NO1 to which a PAD is connected is low, the PG3 becomes 1.8V (VDD). If the output node NO1 to which a PAD is connected is high, the PG3 becomes 1.5V (OVDD-VDD) and the NG3 becomes 3.3V (OVDD). The dynamic gate control unit 300 may be embodied like FIG. 8.

The output driver 30 includes a pull-up driver 10 having first, second and third transistors PM1, PM2 and PM3 of a first conductivity-type connected by a cascode structure between the high voltage OVDD and the output node NO1 and a pull-down driver 20 having first, second and third transistors NM1, NM2 and NM3 of second conductivity type connected by a cascode structure between a ground node and the output node NO1. A driving operation of the output driver 30 is controlled by the dynamic gate control unit 300.

The output driver 30 may be embodied by an output driver that the pull-up driver 10 and the pull-down driver 20 have a three-stage stack cascode structure like FIG. 2

In FIG. 5, a source and a gate of the P-type first transistor PM1 receives the high voltage OVDD and the pull-up driving control voltage PG1 respectively.

A source of the P-type second transistor PM2 is connected to a drain of the P-type first transistor PM1 and a gate of the P-type second transistor PM2 receives the bias voltage PBIAS as a gate voltage. A source of the P-type third transistor PM3 is connected to a drain of the P-type second transistor PM2, a gate of the P-type third transistor PM3 receives the pull-up gate control voltage PG3 and a drain of the P-type third transistor PM3 is connected to the output node NO1.

A drain of the N-type third transistor NM3 is connected to the output node NO1 and a gate of the N-type third transistor NM3 receives the pull-down gate control voltage NG3.

A drain of the N-type second transistor NM2 is connected to a source of the N-type third transistor NM3 and a gate of the N-type second transistor NM2 receives the power supply voltage VDD.

A drain of the N-type first transistor NM1 is connected to a source of the N-type second transistor NM2, a gate of the N-type first transistor NM1 receives a voltage level of the input data being applied through the second gating node ND11 and a source of the N-type first transistor NM1 is connected to a ground node VSS.

Gates of the first, second and third transistors PM1, PM2 and PM3 of first conductivity type (P-type) may receives the pull-up driving control voltage PG1, the bias voltage PBIAS or PG2 and the pull-up gate control voltage PG3 respectively. Swing levels of the pull-up driving control voltage PG1, the bias voltage (PBIAS or PG2) and the pull-up gate control voltage PG3 may be 1.5V~3.3V, 1.5V~3.3V, and 0~1.5V, respectively.

Gates of the first, second and third transistors NM1, NM2 and NM3 of second conductivity type (N-type) may receive a voltage level of the input data being applied through the second gating node ND11, the power supply voltage VDD and the pull-down gate control voltage NG3. Swing levels of the voltage level NG1 of the input data, the power supply voltage VDD and the pull-down gate control voltage NG3 may be 0V-1.8V, 1.8V, and 1.8V-3.3V, respectively.

A voltage swing range of the output node NO1 to which an output pad PAD is connected may be variable from the high voltage OVDD to the ground level VSS. A level of the high voltage OVDD is about 3.3V.

The bias voltage PBIAS may be a voltage obtained by subtracting the power supply voltage VDD from the high voltage OVDD.

A capacitor C1 connected between a gate node PG2 of the second PMOS transistor PM2 and the power supply voltage VDD is a device to provide stabilization to buffer voltage liquidity.

In FIG. 5, the level shifter 100 has a high voltage tolerant function of the pull-up driving control voltage PG1 which is an enable signal of the pull-up driver 10.

The data output driving circuit of FIG. 5 is constituted by low voltage devices and is a circuit for a high speed and a high voltage having wide range voltage output performance which is toggled from 0V to 3.3V or from 0V to 1.8V. Although transistors are manufactured by a manufacturing process for an operation of 1.8V, the transistors have a structure that damage of the transistor is minimized or prevented in an operation of 3.3V. The maximum operation frequency of the circuit is 200 KHz or more and when a wide range operation is performed, a bias voltage according to an input/output (I/O) voltage is automatically controlled even without a control operation of an external device.

The P-type first transistor PM1 is turned on or turned off in response to the pull-up driving control voltage PG1 which is a pull-up driver enable signal being applied to the gate of the PM1. A voltage level of the pull-up driving control voltage PG1 is determined by the level shifter 100.

When a level of the pull-up driving control voltage PG1 reaches a turn on setting voltage PBIAS+Vtp (Vtp is a threshold voltage of a pull-up transistor of the level shifter 100), the P-type first transistor PM1 is turned on.

When the pull-up driving control voltage PG1 of the high voltage (OVDD=3.3V) is applied, the P-type first transistor PM1 is turned off. A voltage applied to a gate terminal of the P-type first transistor PM1 is toggled from PBIAS+Vtp to OVDD or from OVDD to PBIAS+Vtp.

The bias voltage PG2 applied to the P-type second transistor PM2 is provided from the reference voltage generator 200. If the bias voltage PG2 is applied to a gate of the P-type second transistor PM2, it is prevented that a voltage of more than 1.8V is applied between a gate and a source of the P-type first transistor PM1, between a gate and a drain of the P-type first transistor PM1, between a gate and a source of the P-type second transistor PM2 and between a gate and a drain of the P-type second transistor PM2. The bias voltage BIAS is a voltage obtained by subtracting the second power supply voltage VDD from the I/O power supply voltage OVDD.

A gate of the P-type third transistor PM3 receives the pull-up gate control voltage PG3 of the dynamic gate control unit 300. The pull-up gate control voltage PG3 of 0V is provided when a voltage of a PAD at the output node NO1 is low (0V) and the pull-up gate control voltage PG3 of the PBIAS voltage level (OVDD-VDD) is provided when a voltage of the PAD is high (3.3V or 1.8V). If the voltage of the PAD transits from a low level to a high level, a voltage Vds between a drain and a source of the P-type third transistor PM3 is maintained below a power supply voltage level (1.8V) by the pull-up gate control voltage PG3 of the PBIAS voltage level.

The pull-down driver 20 operates in the same manner of the operation of the pull-up driver 10 of the output driver 30. A gate of the N-type first transistor NM1 receives the pull-down driving control voltage NG1 which is an output voltage of the NOR gate GA3. If the pull-down driving control voltage is 0V, the N-type first transistor NM1 is turned off. If the pull-down driving control voltage is the power supply voltage VDD=1.8V, the N-type first transistor NM1 is turned on. The N-type second transistor NM2 receives the power supply voltage VDD through its gate. The N-type second transistor NM2 may prevent a voltage of more than 1.8V from being applied between a gate and a source of the N-type first transistor NM1, between a gate and a drain of the N-type first transistor NM1, between a gate and a source of the N-type second transistor NM2 and between a gate and a drain of the N-type second transistor NM2.

A gate of the N-type third transistor NM3 receives the pull-down gate control voltage NG3. When the voltage of a PAD is low, the pull-down gate control voltage NG3 having a level of the power supply voltage VDD is provided. When the voltage of the PAD is high, the pull-down gate control voltage NG3 having a level of the high voltage OVDD is provided. Thus, even when the voltage of PAD transits from high to low, a voltage Vds between a drain and a source of the N-type third transistor NM3 is maintained below a level of the power supply voltage (VDD-1.8V). Thus, transistors constituting a pull-down driver are protected from device degradation due to HCI.

Figure 6:
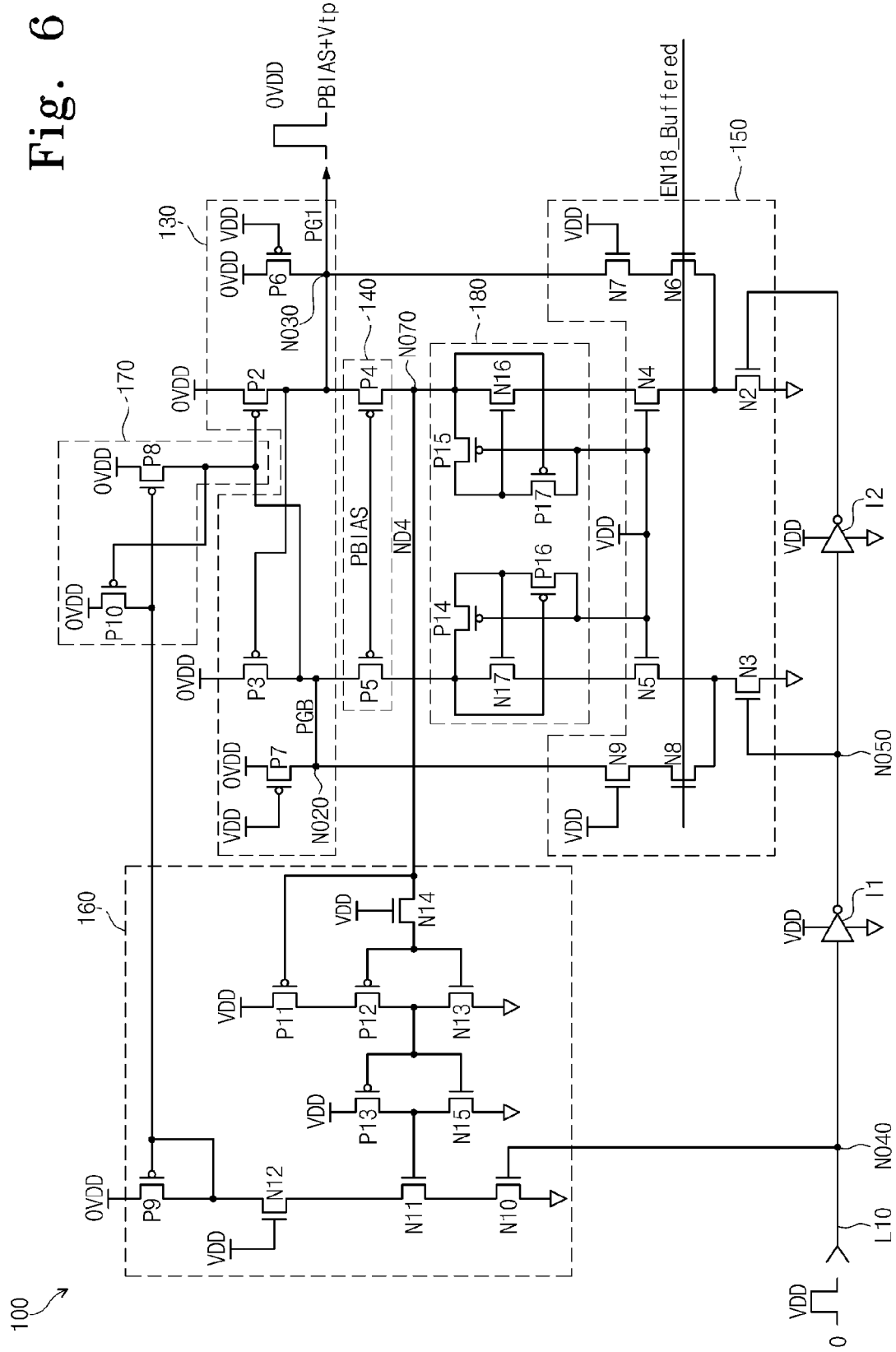
FIG. 6 is a circuit diagram illustrating a level shifter of FIG. 5 according to an embodiment of the present general inventive concept.

FIG. 6 illustrates the level shifter 100 of FIG. 5 according to an embodiment of the present general inventive concept.

Referring to FIG. 6, the level shifter 100 includes a pull-up unit 130 and a pull-down unit 150 connected to each other through a biasing unit 140 constituted by PMOSFETs P4 and P5.

The level shifter 100 includes a speed up unit 160 increasing a level shifting operation speed of the input data being applied to a line L10 through the first gating node.

The level shifter 100 includes a data contention prevention unit 170 preventing a data contention of an output node NO30 to output the pull-up driving control voltage PG1 by turning off pull-up transistors P2 in the pull-up unit 130 before pull-down transistors N2 in the pull-down unit 150 operate. The level shifter 100 is connected between the speed up unit 160 and the pull-up unit 130.

The level shifter 100 may include a hot carrier injection prevention unit 180 to prevent a hot carrier from being injected into pull-down transistors N2~N9 of the pull-down unit 150. The hot carrier injection prevention unit 180 may be connected between the biasing unit 140 and the pull-down unit 150.

The level shifter 100 of FIG. 6 is a high voltage tolerant level shifter and receives the input data having a swing level from 0V to VDD to output the pull-up driving control voltage PG1 having a swing level from PBIAS+Vtp to OVDD to the output node NO30. If the input data is toggled from 0V to VDD, the pull-up driving control voltage PG1 which is an enable signal of the pull-up driver 10 is also toggled from PBIAS+Vtp to the OVDD. If the input data is toggled from VDD to 0V, the pull-up driving control voltage PG1 is toggled from OVDD to PBIAS+Vtp. The Vtp indicates a threshold voltage of PMOSFETs P2 and P6.

The hot carrier injection prevention unit 180 may include P-type MOS transistors P14-P17 and N-type MOS transistors N16 and N17 so that a voltage difference Vds between drains and sources of pull-down transistors N4 and N5 in the pull-down unit 150 can be controlled. The hot carrier injection prevention unit 180 reduces a drain-source voltage of the pull-down transistors N4 and N5 when the pull-up driving control voltage is toggled. As a result, occurrence of an HCI phenomenon of a level shifter is suppressed.

The data contention prevention unit 170 may include P-type MOS transistors P8 and P10 of which gates are connected to mutual drains of the P-type MOS transistors P10 and P8 respectively.

The speed up unit 160 is connected between the high voltage OVDD and the line L10 connected to the first gating node ND10 and may include a plurality of P-type MOS transistors P9, P11-P13 and a plurality of N-type MOS transistors N10-N15 to kick (start) an operation of the data contention prevention unit 170. The speed up unit 160 makes the data contention prevention unit 170 smoothly perform a data contention prevention operation (an operation of turning off the P-type MOS transistor P2 in advance). As a result, the speed up unit 160 can increase a level shifting operation speed. If a level of input data being applied to the line L10 transits from 0V to 1.8V, the N-type MOS transistor N2 in the pull-down unit 150 starts to be turned on. At this time, the P-type MOS transistor P2 maintains a turn-on state during a specific time section without being turned off. During a turn-on operation of the P-type MOS transistor P2, a voltage level of a signal ND4 at a node NO70 is held on a level around OVDD. Thus, to rapidly lower the voltage level of ND4, the N-type MOS transistor N14 in the speed up unit 160 is turned on, and then the N-type and P-type MOS transistors N13 and P13 in the speed up unit 160 are sequentially turned on. The N-type MOS transistor N11 is turned on and the N-type MOS transistor N10 is turned on by the input data. A voltage level of the signal ND4 rapidly descends toward a ground level. Since a gate voltage of the P-type MOS transistor P9 descends toward a low level, the P-type MOS transistor P8 of the data contention prevention unit 170 is turned on and thereby the P-type MOS transistor P2 for pull-up in the pull-up unit 130 is finally turned on. If turning off the P-type MOS transistor P2 for pull-up in the pull-up unit 130 before the N-type MOS transistor N2 for pull-down in the pull-down unit 150 operates, a data contention of output terminal NO30 from which the pull-up driving control voltage PG1 is output may be prevented or minimized.

In FIG. 6, the N-type MOS transistors N6 and N8 receive an enable signal EN18 of a high level through their gates to operate when the high voltage OVDD of 1.8V is given. In this case, the level shifter functions as a level shifter of 1.8V. An inverter 11 is connected between a node NO40 and a node NO50, and an inverter 12 is connected between the node NO50 and the pull-down unit 150.

In the level shifter of FIG. 6, transistor elements constituting the data contention prevention unit 170, the speed up unit 160 and the hot carrier injection prevention unit 180 may be manufactured using a CMOS transistor manufacturing process for an operation of 1.8V.

The level shifter 100 of FIG. 6 is a level shifter to shift a level variable between VDD and OVDD.

If a level of input data is 0V, a level of the pull-up driving control voltage PG1 becomes PBIAS+Vtp. If the input data is toggled from 0V to VDD, the pull-up driving control voltage PG1 is toggled from PBIAS+Vtp to OVDD.

The PMOSFETs P2 and P3 of the pull-up unit 130 and the NMOSFETs N2 and N3 of the pull-down unit 150 constitute a level shifter of a latch type. The PMOSFETs P4 and P5 receive a bias voltage PBIAS through their gates. By setting up the PMOSFETs P4 and P5, drain-source voltages of the PMOSFETs P2 and P3 of the pull-up unit 130 are maintained below a level of the power supply voltage (VDD=1.8V). Since a high voltage is not applied between drains and sources of the PMOSFETs P2 and P3 of the pull-up unit 130, occurrence of HCI phenomenon is prevented.

Also, by setting up the NMOSFETs N4 and N5, drain-source voltages of the NMOSFETs N2 and N3 of the pull-down unit 150 are maintained below a level of the power supply voltage (VDD=1.8V). Since a high voltage is not applied between drains and sources of the NMOSFETs N2 and N3 of the pull-down unit 150, occurrence of HCI phenomenon is prevented.

In a transition operation that an output voltage of the output node NO30 is changed, Vds of the NMOSFETs N4 and N5 may be VDD or more. To prevent device degradation due to HCI, the hot carrier injection prevention unit 180 is prepared. The hot carrier injection prevention unit 180 makes the Vds of the NMOSFETs N4 and N5 become VDD or less.

The PMOSFET P2, NMOSFET N2, PMOSFET P3 and NMOSFET N3 in the level shifter of latch type may have a contention operation section in which they are turned on at the same time. The contention operation section may become a cause of a speed down. The data contention prevention unit 170 constituted by the PMOSFETs P8 and P9 turns off the PMOSFET P2 before the NMOSFET N2 is turned on and minimizes or removes the contention operation section.

A size of the PMOSFET P3 may be minimized or reduced by the transistors N10-N14 and P8-P13 constituting the speed up unit 160 and the data contention prevention unit 170. Thus, when the NMOSFET N3 is turned on, a contention operation section in which the PMOSFET P3 is turned on is minimized.

A PGB voltage of the node NO20 rises toward a high level set by a turn-on operation of the PMOSFET P8 and after the PGB voltage rise to the high level, the PMOSFET P8 is turned off. After that, the PGB voltage maintains the high level by the PMOSFET P3. Although the size of the PMOSFET P3 is small, the PGB voltage can maintain the high level by the transistors constituting the speed up unit 160 and the data contention prevention unit 170. The speed up unit 160 makes the level shifter operate at a frequency, for example, 200 MHz or more.

Figure 7:
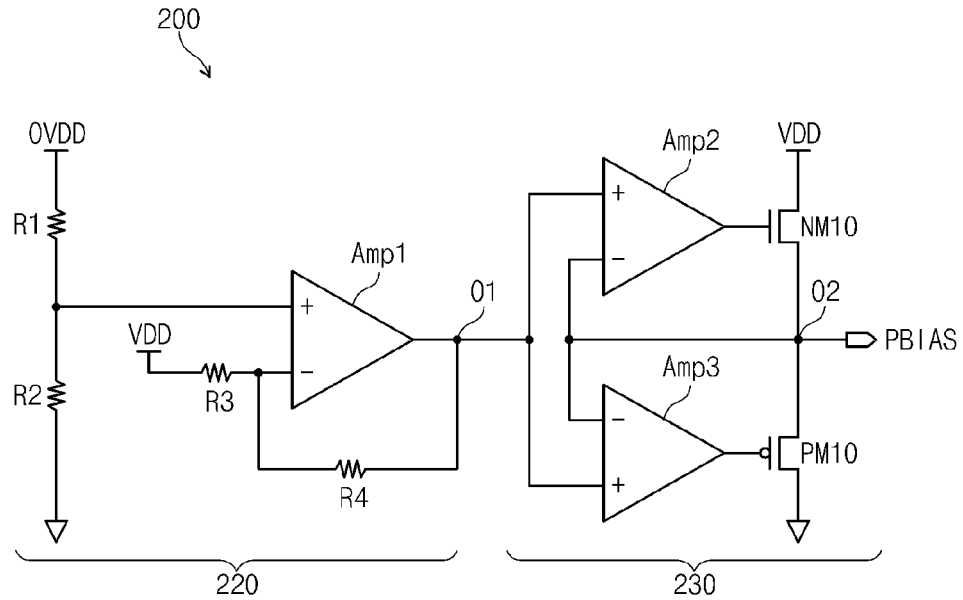
FIG. 7 is a circuit diagram illustrating a voltage generator of FIG. 5 according to an embodiment of the present general inventive concept.

FIG. 7 illustrates the reference voltage generator 200 of FIG. 5 according to an embodiment of the present general inventive concept.

Referring to FIG. 7, the reference voltage generator 200 may include a voltage generator 220 and a current buffer 230.

The voltage generator unit 220 includes a comparator Amp1 of differential amplifier type comparing a voltage obtained by dividing the high voltage OVDD by resistors R1 and R2 with the power supply voltage VDD and can variably generate the reference voltage PBIAS. A resistor R3 connected to the power supply voltage VDD and the resistor R1 connected to the high voltage OVDD may have the same resistance.

The reference voltage PBIAS may be a difference between the high voltage OVDD and the power supply voltage VDD, that is, a voltage obtained by subtracting the power supply voltage VDD from the high voltage OVDD.

The current buffer 230 may include two comparators Amp2 and Amp3 and transistors NM10 and PM10. The current buffer 230 is connected to an output terminal of the comparator Amp1 to buffer fluctuation of the reference voltage PBIAS. The current buffer 230 performs a function of supplying a high current to the PBIAS. When an output driver transits, fluctuation of the reference voltage PBIAS may occur by an induced current. The current buffer 230 minimizes the fluctuation to stabilize a level of the reference voltage.

An I/O power supply is changed to a wide range such that an output level of the reference voltage PBIAS of the reference voltage generator 200 is automatically changed. That is, without a separate external control, the reference voltage PBIAS is represented by OVDD-VDD.

Changing a bias voltage according to an I/O voltage may be considered from a system level design including a chip design. However, if using the reference voltage generator 200, there is not necessary to consider changing a bias voltage. Therefore, a system having a first bias voltage can apply the first bias voltage to an output driver having a transistor requiring a second bias voltage lower than the first bias voltage, without changing the first bias voltage, according to an embodiment of the present general inventive concept.

Figure 8:
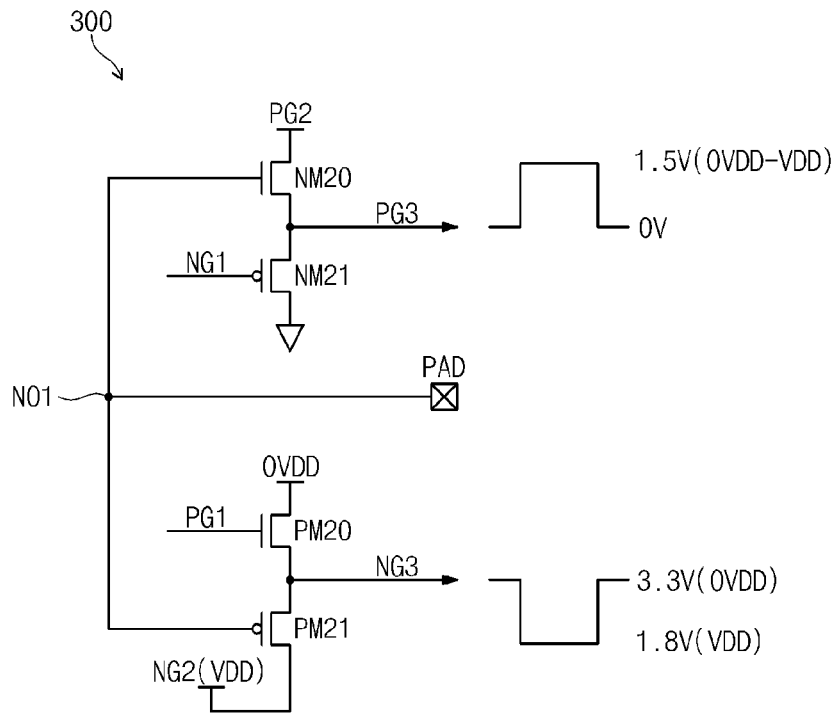
FIG. 8 is a circuit diagram illustrating a dynamic gate control unit of FIG. 5 according to an embodiment of the present general inventive concept.

FIG. 8 illustrates the dynamic gate control unit 300 of FIG. 5 according to an embodiment of the present general inventive concept.

The dynamic gate control unit 300 includes a first MOS transistor NM20, a second NMOS transistor NM21, a first PMOS transistor PM20 and a second PMOS transistor PM21. Each of the transistors may be a field effect transistor (FET).

The first NMOS transistor NM20 includes a drain to receive the reference voltage PBIAS, a gate to receive the output node NO1 voltage, and a source to receive the pull-up gate control voltage PG3.

A drain-source channel of the second NMOS transistor NM21 is connected between the source of the first NMOS transistor NM20 and a potential, such as a potential of a ground node when the second NMOS transistor NM21 responds to the input data voltage NG1 being applied to its gate.

The first PMOS transistor PM20 includes a source to receive the high voltage OVDD and a drain to output the pull-down gate control voltage NG3 in response to the pull-up driving control voltage PG1.

A drain-source channel of the second PMOS transistor PM21 is connected between the pull-down gate control voltage NG3 and the power supply voltage (VDD, NG2) when the second PMOS transistor PM21 receives a voltage of the output node NO1 through its gate.

If NG1 and PG1 are high, a pad voltage of a PAD at a node NO1 becomes low. Thus, the first NMOS transistor NM20 is turned off and the second NMOS transistor NM21 is turned on and thereby PG3 becomes 0V. The first PMOS transistor PM20 is turned off and the second PMOS transistor PM21 is turned on and thereby the NG3 becomes the OVDD level.

Figure 9:
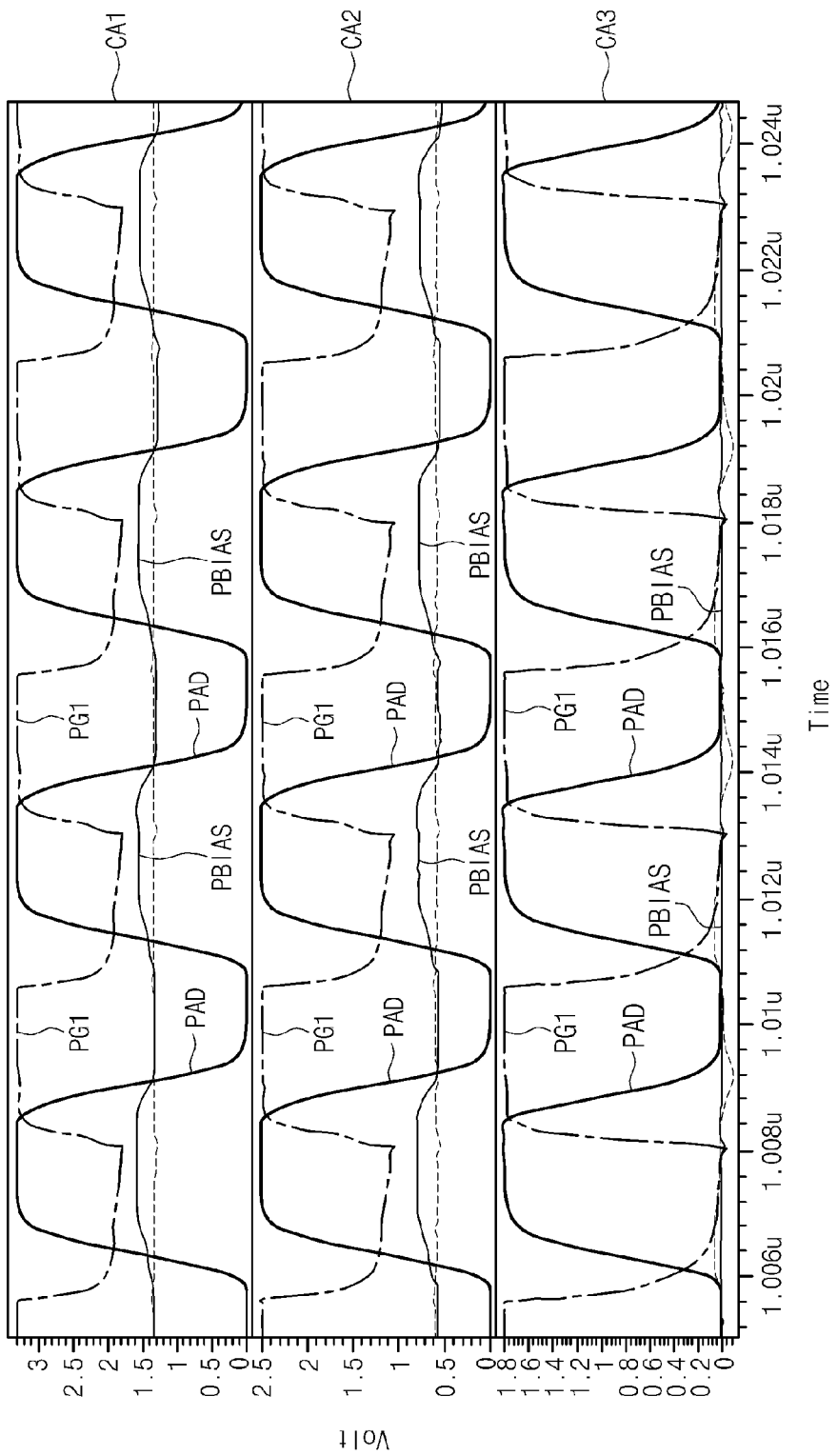
FIG. 9 is an operation waveform of the data output driving circuit of FIG. 5 according to an embodiment of the present general inventive concept.

FIG. 9 is a graphic illustrating an operation waveform of the data output driving circuit of FIG. 5.

FIG. 9 illustrates simulation results obtained when operating the data output driving circuit of FIG. 5 according to a load, such as 5 pF load, at a frequency, such as 200 MHz.

The graphic includes three cases. A horizontal axis represents a time and a vertical axis represents a voltage.

Waveforms of a first case CA1 represent waveforms of PG1, PAD and PBIAS of the output driver when OVDD is 3.3V and VDD is 1.8V.

In a high section of the PAD waveform, a level of the PBIAS rises to about 1.6V or more.

Waveforms of a second case CA2 represent waveforms of PG1, PAD and PBIAS of the output driver when OVDD is 2.5V and VDD is 1.8V.

Waveforms of a third case CA3 represent waveforms of PG1, PAD and PBIAS of the output driver when OVDD is 1.8V and VDD is 1.8V.

Through the simulation result of FIG. 9, an output driving circuit constituted by transistors manufactured for a low voltage may operate in a high speed and high voltage operation and wide range output performance.

Figure 10:
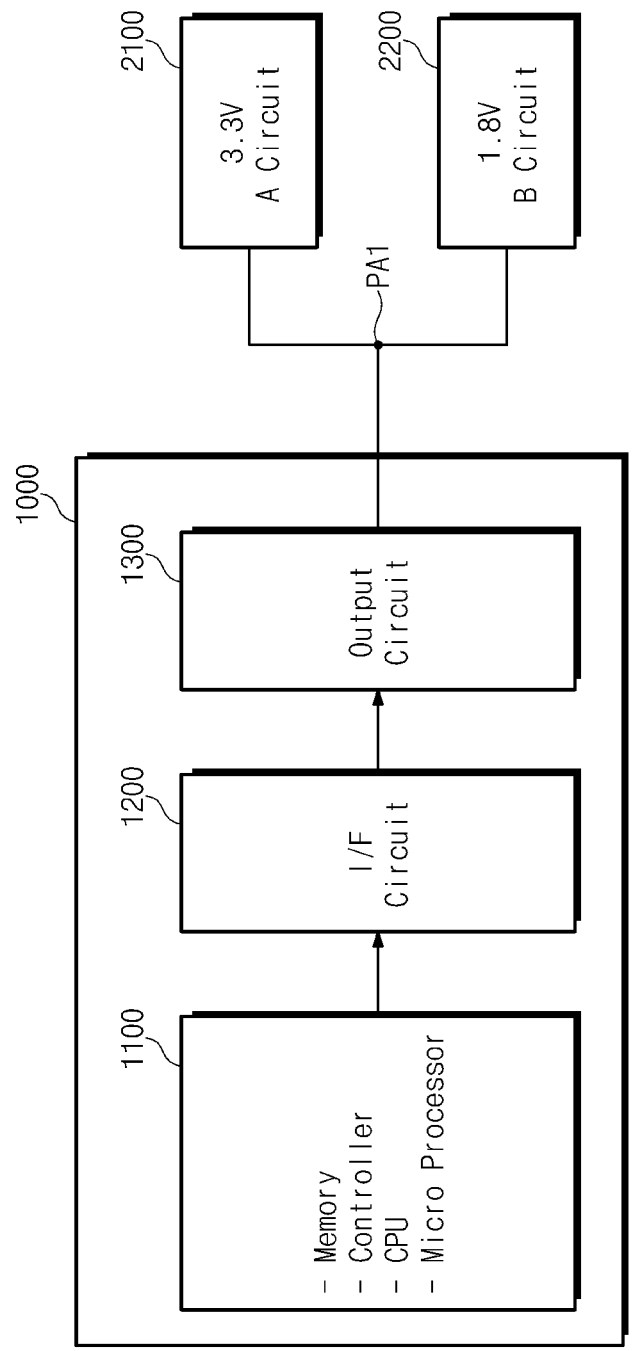
FIG. 10 is a block diagram illustrating a data processing system using the data output driving circuit of FIG. 5 according to an embodiment of the present general inventive concept.

FIG. 10 is a block diagram illustrating a data processing system using the circuit of FIG. 5 according to an embodiment of the present general inventive concept.

Referring to FIG. 10, the data processing system includes a semiconductor integrated circuit 1000 and first and second circuits 2100 and 2200.

The first circuit 2100 may be a circuit for 3.3V operation and the second circuit 2200 may be a circuit for 1.8V operation. The first circuit 2100 and the second circuit 2200 may be functional devices or units to perform a function of the data processing system according to a signal transmitted from the semiconductor integrated circuit 1000 to the corresponding first and/or second circuit 2100 and 2200. The first circuit 2100 and the second circuit 220 may further include mechanical and/or electrical elements to perform the function corresponding to the signal.

The semiconductor integrated circuit 1000 may include first, second and third circuit blocks 1100, 1200 and 1300. The first circuit block 1100 may be a semiconductor memory, a controller, a CPU or a microprocessor. The second circuit block 1200 is an interface circuit. The third circuit block 1300 is an output circuit to which the circuit illustrated in FIG. 5 may be applied.

When data being output from the first circuit block 1100 is high, a level of the data may be about 1.0V. The second circuit block 1200 may interface the data of 1.0V to 1.8V level. The third circuit block 1300 level-shifts the data of 1.8V to 3.3V level to provide the level-shifted data of 3.3V to the first circuit 2100 through an output node PA1.

When the third circuit block 1300 has a level shifting output of 1.8V, the second circuit block 1200 is removed. In this case, the third circuit block 1300 provides the level-shifted data of 1.8V to the second circuit 2200 through the output node PA1.

If the third circuit block 1300 is embodied by the data output driving circuit like FIG. 5, even using devices manufactured for a low voltage, a high speed and high voltage operation can be reliably accomplished.

If the first circuit block 1100 is a semiconductor memory, it may be embodied by a volatile memory device or a nonvolatile memory device.

When the first circuit block 1100 is embodied by a volatile memory device, the volatile memory device may be a DRAM or a SRAM.

When the first circuit block 1100 is embodied by a non-volatile memory device, the nonvolatile memory device may be a mask ROM, an electrically erasable and programmable ROM (EEPROM), an erasable and programmable ROM (EEPROM), etc. Since the EEPROM can electrically erase or write data, an application of the EEPROM is extending toward a system programming requiring a continuous renewal or an auxiliary memory device. Since a flash EEPROM has a high integration as compared with a conventional EEPROM, it can be advantageously applied to a mass storage auxiliary memory device.

Figure 11:
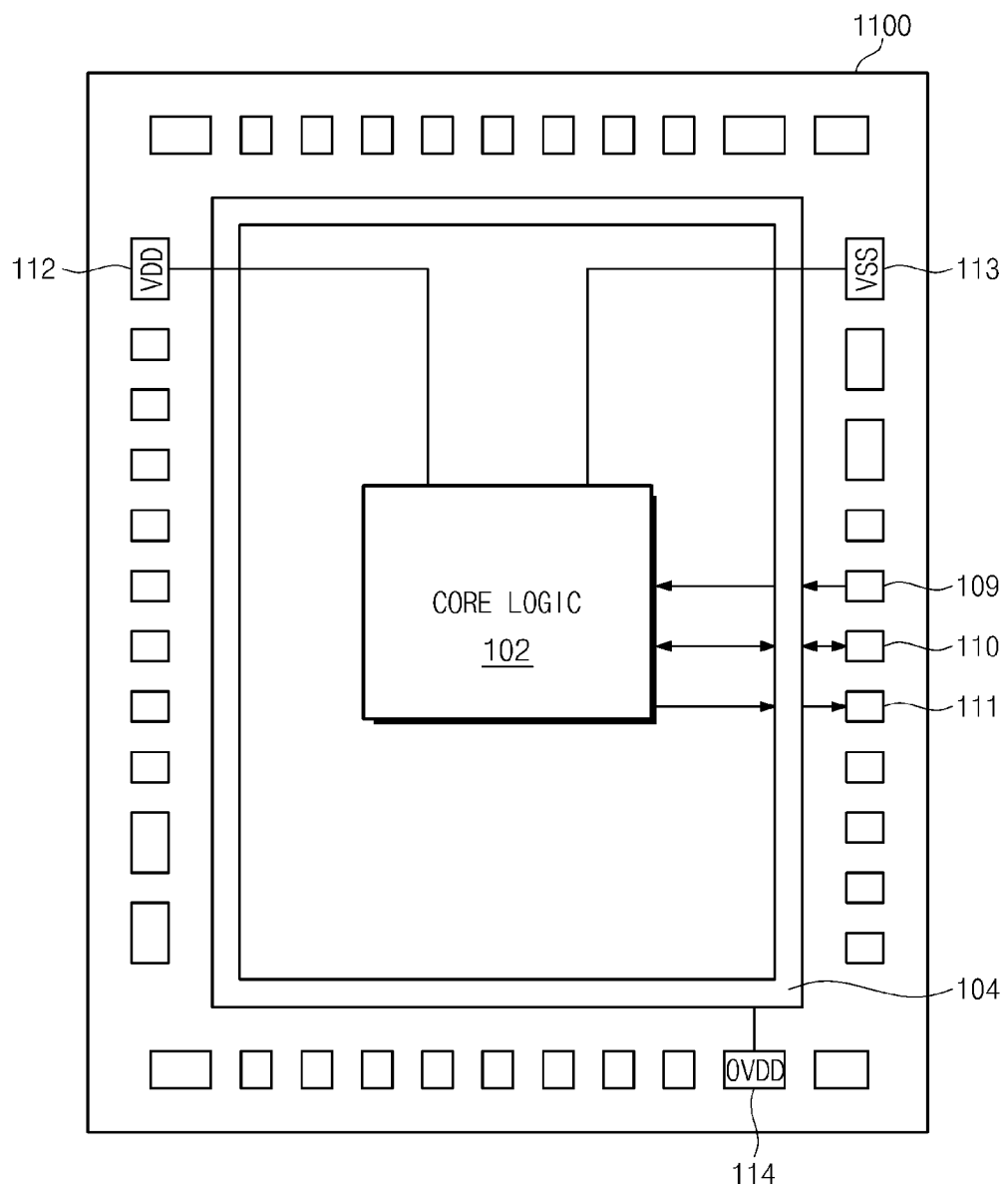
FIG. 11 is a view illustrating a chip layout structure of the data processing system of FIG. 10 according to an embodiment of the present general inventive concept.

FIG. 11 illustrates a chip layout structure of the first circuit block 1100 of the data processing system of FIG. 10 according to an embodiment of the present general inventive concept.

Referring to FIG. 11, a core logic 102 is disposed in the center of chip of a first circuit block 1100 of the data processing system. An I/O circuitry 104 is disposed close to an edge of the chip as compared with the core circuit 102.

Among contact pads 109-114, the contact pad 112 is an exclusive pad of input and the contact pad 111 is an exclusive pad of output. The contact pad 110 is a pad for both input and output.

Among the contact pads 109-114, the contact pad 112 is a pad for supplying a power supply voltage VDD. The contact pad 113 is a pad for supplying a ground voltage VSS. The contact pads 112 and 113 may be connected to the core logic 102.

The contact pad 114 is a pad for supplying a high voltage OVDD or a voltage for I/O and may be connected to the I/O circuitry 104.

The I/O circuit 104 receives the high voltage OVDD, the power supply voltage VDD and the ground voltage VSS to perform a function of the data output driving circuit of FIG. 5.

In this case, levels of the high voltage and the power supply voltage will be explained with reference to FIG. 12.

Figure 12:
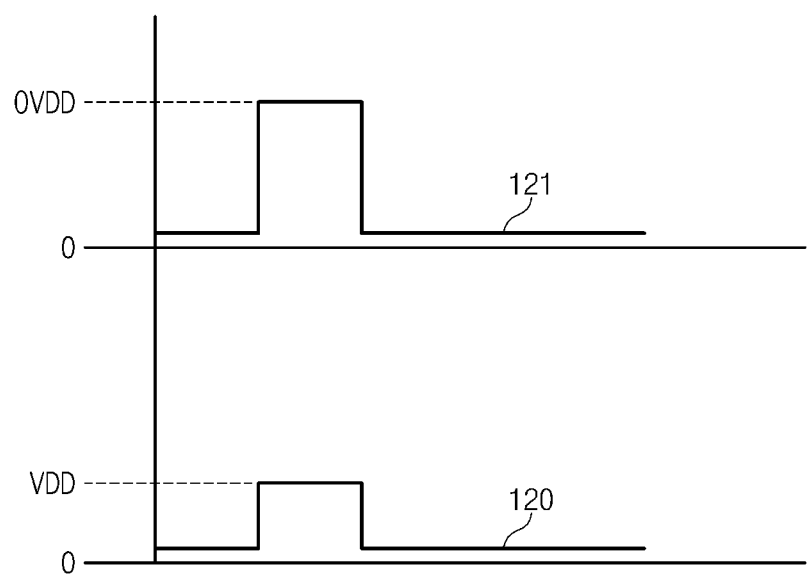
FIG. 12 is an example of voltage waveforms being applied to power supply pads of FIG. 11.

FIG. 12 illustrates voltage waveforms being applied to power supply pads of FIG. 11.

A waveform 121 shows a level of the high voltage OVDD being applied to the pad 114. A waveform 120 shows a level of the power supply voltage VDD being applied to the pad 112. In FIG. 12, a horizontal axis represents a time and a vertical axis represents a voltage.

Since the I/O circuitry 104 receives a voltage level set up through the pads 112 and 113 illustrated in FIG. 11 to perform the circuit function of FIG. 5, it provides a high voltage and a high speed operation which the circuit of FIG. 5 has. The designed function of the I/O circuit can be reliably accomplished.

The chip of FIG. 11 may be include various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

Figure 13:
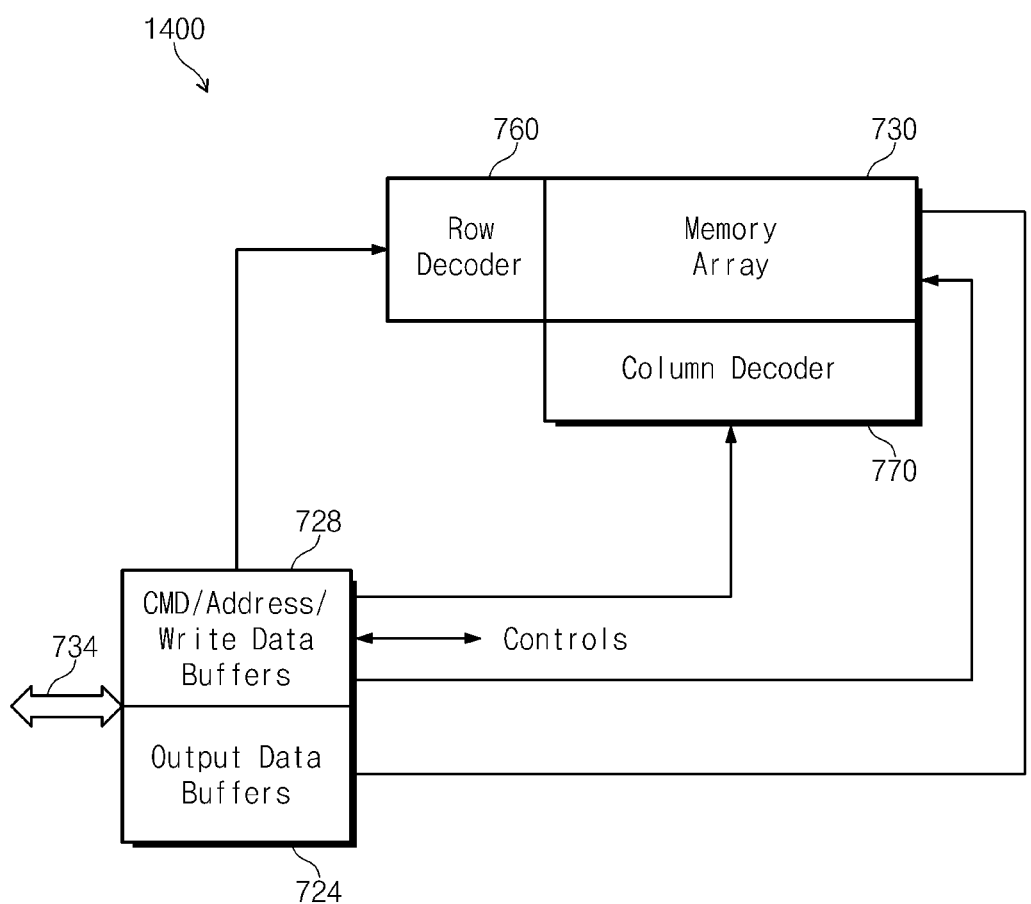
FIG. 13 is a block diagram of a semiconductor memory device using the data output driving circuit of FIG. 5 according to an embodiment of the present general inventive concept.

FIG. 13 is a block diagram illustrating a semiconductor memory device using the circuit of FIG. 5 according to an embodiment of the present general inventive concept.

Referring to FIG. 13, the semiconductor device 1400 may include a memory array 730, a row decoder 760, a column decoder 770, command/address/write data buffers 728 and output data buffers 724.

The memory array 730 may include a plurality of DRAM memory cells, SRAM memory cells, NAND type EEPROM cells and NOR type EEPROM cells.

The command/address/write data buffers 728 receive command, address and write data to perform a buffering.

The row decoder 760 decodes a row address to select a row of the memory array 730. The column decoder 770 decodes a column address to select a column of the memory array 730.

The output data buffers 724 buffers data output from the memory array 730. In a read operation mode, the output data buffers 724 output the output data to an I/O bus 734.

The output data buffers 724 may be embodied using the circuit of FIG. 5. In this case, a semiconductor memory device can perform a high voltage operation and a high speed operation. A wide range voltage operation is embodied in the output data buffers 724 to provide wide range output performance to the system.

Figure 14:
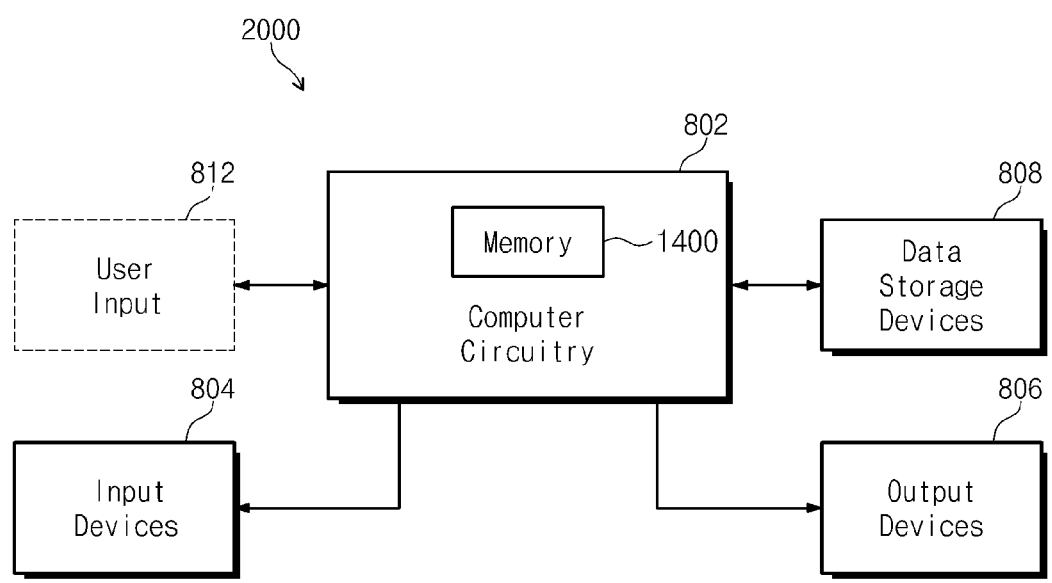
FIG. 14 is a block diagram illustrating an electronic system using the data output driving circuit of FIG. 5 according to an embodiment of the present general inventive concept.

FIG. 14 is a block diagram illustrating an electronic system 2000 using the circuit of FIG. 5 according to an embodiment of the present general inventive concept.

Referring to FIG. 14, the electronic system 2000 may include a computer circuitry 802 including a memory 1400, input devices 804, output devices 806 and data storage devices 808. For convenience of users, a user input 812 may be further included in the electronic system 2000. The user input 812 may be an input device including a numeric key, a function key, etc. and performs a function of interfacing the electronic system 2000 with a person.

In FIG. 14, in a case that a display unit is further included, the display unit may be embodied by a liquid crystal device having a backlight, a liquid crystal device having a LED light source or an OLED device. The display unit functions as an output device displaying an image such as a charter, number, picture, etc. by a color.

The electronic system 2000 can function as a mobile communication device or a smart card by adding or subtracting constituent elements when necessary.

The electronic system 2000 can be connected to an external communication device through a separate interface. The communication device may be a digital versatile disc (DVD) player, a computer, a set top box (STB), a game machine, a digital camcorder, etc.

Although not illustrated in the drawing, the electronic system may further include an application chipset, a camera image processor (CIS), a mobile DRAM, etc.

The data storage devices 808 can store information having various types of data such as text, graphic, software code, etc.

The data storage devices 808 may be embodied by an electrically erasable programmable read-only memory (EEPROM), a flash memory, a magnetic random access memory (MRAM), a spin-transfer torque MRAM, a conductive bridging RAM (CBRAM), a ferroelectric RAM (FeRAM), a phase change RAM (PRAM) which is called an ovonic unified memory (OUM), a resistive RAM (RRAM), a nanotube RRAM, a polymer RAM (PoRAM), a nanotube floating gate memory (NFGM), a holographic memory, a molecular electronics memory device, or an insulator resistance change memory.

The circuit of FIG. 5 constituted by transistors for a low voltage may be installed in the computer circuit 802, the data storage devices 808 or the output devices 806. In that case, a speed of output operation increases to improve performance of electronic system 2000.

According to some embodiments of the inventive concept, a high voltage operation and a high speed operation are reliably accomplished by transistors manufactured for a low voltage. A wide range voltage operation is embodied in an output driver or a data output driving circuit using the output driver.

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and advantages of the present invention. Accordingly, all such modifications are intended to be included within the scope of the present invention as defined in the claims. The present invention is defined by the following claims, with equivalents of the claims to be included

What is claimed is:

1. An output driver comprising:
a pull-up driver including first, second and third transistors of a first conductivity type connected by a cascade structure between a voltage supply node and an output node; and
a pull-down driver including first, second and third transistors of a second conductivity type are connected by a cascode structure between a ground node and the output node,
wherein a first high voltage, a first power supply voltage and a ground voltage are applied to respective gates of the first, second and third transistors of the first conductivity type.

2. The output driver of claim 1, wherein a ground voltage, a second power supply voltage and a second high voltage are applied to respective gates of the first, second and third transistors of the second conductivity type.

3. The output driver of claim 2, wherein the second power supply voltage is higher than the first power supply voltage.

4. The output driver of claim 2, wherein the first high voltage is applied to the voltage supply node.

5. The output driver of claim 2, wherein the first, second and third transistors of the first conductivity type are PMOSFETs and the first, second and third transistors of the second conductivity type are NMOSFETs.

6. The output driver of claim 2, wherein the first high voltage, the first power supply voltage and the second power supply voltage are 3.3V, 1.5V and 1.8V respectively.

7. The output driver of claim 2, wherein the first, second and third transistors are output drivers manufactured using a CMOS manufacturing process for an operation voltage of 1.8V.

8. The output driver of claim 7, wherein a voltage swing range of the output node is from 0V to 3.3V.

9. A data output driving circuit comprising:
 a reference voltage generator to compare a voltage corresponding to a high voltage with a power supply voltage autonomously without depending on an external control to variably generate a reference voltage as a bias voltage;
 a level shifter to shift input data to a swing level of the high voltage to output the shifted input data as a pull-up driving control voltage;
 a dynamic gate control unit to receive the high voltage and the reference voltage as an operation power supply and to generate pull-up and pull-down gate control voltages in response to voltage levels of an output node voltage, the pull-up driving control voltage and the input data; and
 an output driver comprising a pull-up driver including first, second and third transistors of a first conductivity type connected by a cascode structure between a voltage supply node and the output node and a pull-down driver including first, second and third transistors of a second conductivity type connected by a cascode structure between a ground node and the output node, a driving operation of the output driver being controlled by the dynamic gate control unit.

10. The data output driving circuit of claim 9, wherein gates of the first, second and third transistors of the first conductivity type receive the pull-up driving control voltage, the bias voltage and the pull-up gate control voltage, respectively.

11. The data output driving circuit of claim 10, wherein gates of the first, second and third transistors of the second conductivity type receive the voltage level of the input data, the power supply voltage and the pull-down gate control voltage being applied through the second gating node.

12. The data output driving circuit of claim 11, wherein a voltage swing range of the output node is between a high voltage level and a ground level.

13. The data output driving circuit of claim 11, wherein the first conductivity type is a P-type and the second conductivity type is an N-type.

14. The data output driving circuit of claim 11, further comprising:
 an input gating unit to gate the input data according to an output enable state signal to output the gated input data to the level shifter as a swing level of the power supply voltage through a first gating node and to output the gated input data to the dynamic gate control unit as a swing level of power supply voltage through a second gating node.

15. The data output driving circuit of claim 11, wherein the bias voltage is a voltage obtained by subtracting the power supply voltage from the high voltage.

16. The data output driving circuit of claim 11, wherein gate oxidation layers of the first, second and third transistors of the first and second conductivity type are manufactured using a CMOS transistor manufacturing process for an operation voltage of 1.8V.

17. The data output driving circuit of claim 11, wherein:
 the first conductivity type is a P-type and the second conductivity type is an N-type;
 a source of the P-type first transistor receives the high voltage and a gate of the P-type first transistor receives the pull-up driving control voltage;
 a source of the P-type second transistor is connected to a drain of the P-type first transistor and a gate of the P-type second transistor receives the bias voltage; and
 a source of the P-type third transistor is connected to a drain of the P-type second transistor and a gate of the P-type third transistor receives the pull-up gate control voltage and a drain of the P-type third transistor is connected to the output node.

18. The data output driving circuit of claim 17, wherein:
 a drain of the N-type third transistor is connected to the output node and a gate of the N-type third transistor receives the pull-down gate control voltage;
 a drain of the N-type second transistor is connected to a source of the N-type third transistor and a gate of the N-type second transistor receives the power supply voltage; and
 a drain of the N-type first transistor is connected to a source of the N-type second transistor, a gate of the N-type first transistor receives a voltage level of the input data being applied through the second gating node and a source of the N-type first transistor is connected to a around node.

19. The data output driving circuit of claim 17, wherein the input gating unit comprises:
 a NAND gate to receive the input data and the out enable state to generate a NAND response through the first gating node;
 an inverter to invert the out enable state; and
 a NOR gate to receive a logic that inverted an output of the NAND gate and an output logic of the inverter to generate a NOR response through the second gating node.

20. The data output driving circuit of claim 17, wherein the reference voltage generator includes a differential amplifier type comparator to compare a voltage obtained by dividing the high voltage by resistors with the power supply voltage to variably generate the reference voltage.

21. The data output driving circuit of claim 17, wherein the level shifter comprises:
 a pull-up unit and a pull-down unit connected to each other through a biasing unit;
 a speed up unit to increase a level shifting operation speed of the input data being applied through the first gating node;
 a data contention prevention unit connected between the speed up unit and the pull-up unit to prevent a data contention of output terminal at which the pull-up driving control voltage is output by turning off a pull-up transistor in the pull-up unit in advanced before a pull-down transistor in the pull-down unit operates; and
 a hot carrier injection prevention unit connected between the biasing unit and the pull-down unit to prevent a hot carrier from being injected into pull-down transistors in the pull-down unit.

22. The data output driving circuit of claim 17, wherein the dynamic gate control unit comprises:
 a first NMOS transistor having a drain to receive the reference voltage, a gate to receive the output node voltage, and a source to output the pull-up gate control voltage;
 a second NMOS transistor having a drain-source channel connected between the source of the first NMOS transistor and a ground node to respond a voltage level of the input data;
 a first PMOS transistor having a source to receive the high voltage and a drain to output the pull-down gate control voltage in response to the pull-up driving control voltage; and
 a second PMOS transistor having a source-drain channel between the pull-down gate control voltage and the power supply voltage and a gate to receive the output node voltage.

23. The data output driving circuit of claim 20, wherein the reference voltage generator further comprises a current buffer connected to an output terminal of the comparator to buffer current liquidity of the reference voltage.

24. The data output driving circuit of claim 21, wherein the hot carrier injection prevention unit comprises P-type MOS transistors and N-type MOS transistors to reduce a voltage difference between a drain and a source of pull-down transistor in the pull-down unit.

25. The data output driving circuit of claim 21, wherein the data contention prevention unit comprises two P-type MOS transistors having gates connected to mutual drains of the P-type MOS transistors, respectively.

26. The data output driving circuit of claim 21, wherein the speed up unit is connected between the high voltage and the first gating node and comprises a plurality of P-type MOS transistors and N-type MOS transistors to kick an operation of the data contention prevention unit.

27. The data output driving circuit of claim 21, wherein the data output driving circuit comprises one of a semiconductor memory, a controller, a central processing unit and a microprocessor.

28. A level shifter comprising:
a pull-up unit and a pull-down unit connected to each other through a biasing unit;
a speed up unit to increase a level shifting operation speed of input data being applied through a first gating node;
a data contention prevention unit connected between the speed up unit and the pull-up unit to prevent a data contention of output terminal at which a pull-up driving control voltage is output by turning off a pull-up transistor in the pull-up unit before a pull-down transistor in the pull-down unit operates; and
a hot carrier injection prevention unit connected between the biasing unit and the pull-down unit to prevent a hot carrier from being injected into pull-down transistors in the pull-down unit.

29. The level shifter of claim 28, wherein at least three pull-up transistors are connected to a pull-up driver that is connected between a high voltage and an output node in a stack structure of three stages or more to apply a pull-up driving control voltage to a gate of one of the pull-up transistors.

30. The level shifter of claim 29, wherein the pull-up driving control voltage swings between the high voltage and a voltage higher than a biasing voltage of the biasing unit.

31. An output driver, comprising:
a pull-up driver including first, second and third first type transistors connected between a voltage supply node and an output node of a pad; and
a pull-down driver including first, second and third second type transistors connected between the output node of the pad and a ground potential node,
wherein an output voltage is output through the output node of the pad according to an alternative operation of the pull-up driver and the pull-down driver,
the first, second, and third first type transistors of the pull-up driver have gates to sequentially receive corresponding gate signals such that the pull-up driver is an operable state in response to a difference between voltages of the voltage supply node and the output node, and
the first, second, and third second type transistors of the pull-down driver have gates to sequentially receive corresponding gate signals such that the pull-down driver is an operable state in response to a difference between voltages of the output node and the ground node.

32. An output driver comprising:
a pull-up driver including three or more first type transistors connected between a voltage supply node and an output node of a pad; and
a pull-down driver including three or more second type transistors connected between the output node of the pad and a ground potential node,
wherein an output voltage is output through the output node of the pad according to an alternative operation of the pull-up driver and the pull-down driver,
a pull-up voltage range of voltages of the pull-up driver between the voltage supply node and the output node and a pull-down voltage range of voltages of the pull-down driver between the output node and the ground node are same, and
a voltage range of a voltage to be applied to each of the transistors is smaller than the pull-up and pull-down voltage ranges.

33. A system comprising:
an output driver control unit to sequentially generate pull-up gate signals and pull-down gate signals in response to input data and a voltage of a voltage supply node; and
an output driver comprising:
a pull-up driver including three or more first type transistors connected in series between the voltage supply node and an output node of a pad to be operable according to the sequential pull-up gate signals to output an output voltage to the output node of the pad; and
a pull-down driver including three or more second type transistors connected in series between the output node of the pad and a ground node to be operable according to the sequential pull-down gate signals to output the output voltage to the output node of the pad.

34. The system of claim 33, further comprising:
a functional circuit connected to the output node of the pad to perform a function thereof according to the output voltage of the output node of the pad,
wherein the output voltage of the output node and the voltage of the voltage supply node have a maximum voltage range, and voltages applied to the respective transistors have a voltage range lower than a half of the maximum voltage range.

* * * * *